(12) United States Patent
Wagner et al.

(10) Patent No.: US 7,626,183 B2
(45) Date of Patent: *Dec. 1, 2009

(54) METHODS FOR MODIFYING FEATURES OF A WORKPIECE USING A GAS CLUSTER ION BEAM

(75) Inventors: Reinhard Wagner, Ilmmuenster (DE); Wesley Skinner, Andover, MA (US)

(73) Assignee: TEL Epion Inc., Billerica, MA (US)

( * ) Notice: Subject to any disclaimer, the term of this patent is extended or adjusted under 35 U.S.C. 154(b) by 308 days.

This patent is subject to a terminal disclaimer.

(21) Appl. No.: 11/850,423

(22) Filed: Sep. 5, 2007

(65) Prior Publication Data

US 2009/0057574 A1 Mar. 5, 2009

(51) Int. Cl.
*G21K 5/04* (2006.01)
*G21K 5/10* (2006.01)

(52) U.S. Cl. .......................... 250/492.21; 250/492.3; 257/E21.583; 204/192.3; 204/192.1; 204/192.34; 204/298.04; 204/298.36; 427/534; 118/723 CB; 216/66

(58) Field of Classification Search ............... 250/492.1, 250/492.2, 492.3, 492.21; 257/E21.525, 257/E21.582, E21.583; 204/192.1, 192.3, 204/192.34, 298.04, 298.36; 427/534; 118/723 CB; 216/38, 59, 66

See application file for complete search history.

(56) References Cited

U.S. PATENT DOCUMENTS

| 6,537,606 | B2* | 3/2003 | Allen et al. ............... 427/9 |
| 6,750,460 | B2 | 6/2004 | Greer |
| 7,550,748 | B2* | 6/2009 | Caliendo et al. ....... 250/492.21 |
| 7,550,749 | B2* | 6/2009 | Caliendo et al. ....... 250/492.21 |
| 2007/0077499 | A1* | 4/2007 | Ikuta et al. ............... 430/5 |
| 2008/0142480 | A1* | 6/2008 | Otsuka ................... 216/59 |
| 2009/0057574 | A1* | 3/2009 | Wagner et al. ......... 250/492.21 |

* cited by examiner

*Primary Examiner*—Bernard E Souw
(74) *Attorney, Agent, or Firm*—Wood, Herron & Evans LLP (57) ABSTRACT

Embodiments of methods of modifying surface features on a workpiece with a gas cluster ion beam are generally described herein. Other embodiments may be described and claimed.

15 Claims, 4 Drawing Sheets

METHODS FOR MODIFYING FEATURES OF A WORKPIECE USING A GAS CLUSTER ION BEAM

FIELD OF THE INVENTION

The invention relates generally to methods for treating a workpiece with a gas cluster ion beam.

BACKGROUND INFORMATION

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Although GCIB processing of workpieces is performed using a wide variety of gas-cluster source gases, many of which are inert gases, many semiconductor processing applications use reactive source gases, sometimes in combination or mixture with inert or noble gases, to form the GCIB.

Measurement of thin films may be performed using measurement techniques utilizing reflection scattering, diffraction, spectroscopy, and/or polarization detection using a beam of light, x-rays, or electrons. Features on films or workpieces may be measured using optical digital profilometry, which is a non-destructive metrology technology that utilizes optical instruments based on spectroscopic ellipsometry or reflectometry to precisely measure critical dimensions (CDs), sidewall angles, and multiple layer film thicknesses. These measurements can be made on both two-dimensional line/space structures, as well as three-dimensional hole or island structures. The process is executed in-line, which eliminates the need to destructively process the wafer to perform the analyses.

BRIEF DESCRIPTION OF THE DRAWINGS

The present invention is illustrated by way of example and not as a limitation in the figures of the accompanying drawings, in which.

DETAILED DESCRIPTION

There is a general need for an ability to modify surface features of a workpiece to normalize one or more properties of the surface features, to correct non-uniformities among the surface features, or to intentionally create non-uniformities in the surface features. A gas cluster ion beam (GCIB) may be employed to either selectively form material on the surface features or to selectively erode or etch material from the surface features. In this manner, the surface features may be modified to provide one or more desired characteristics, such as providing a uniform critical dimension of one or more structures. An apparatus and method for modifying surface features on a workpiece using a GCIB is disclosed in various embodiments.

Figure 1:
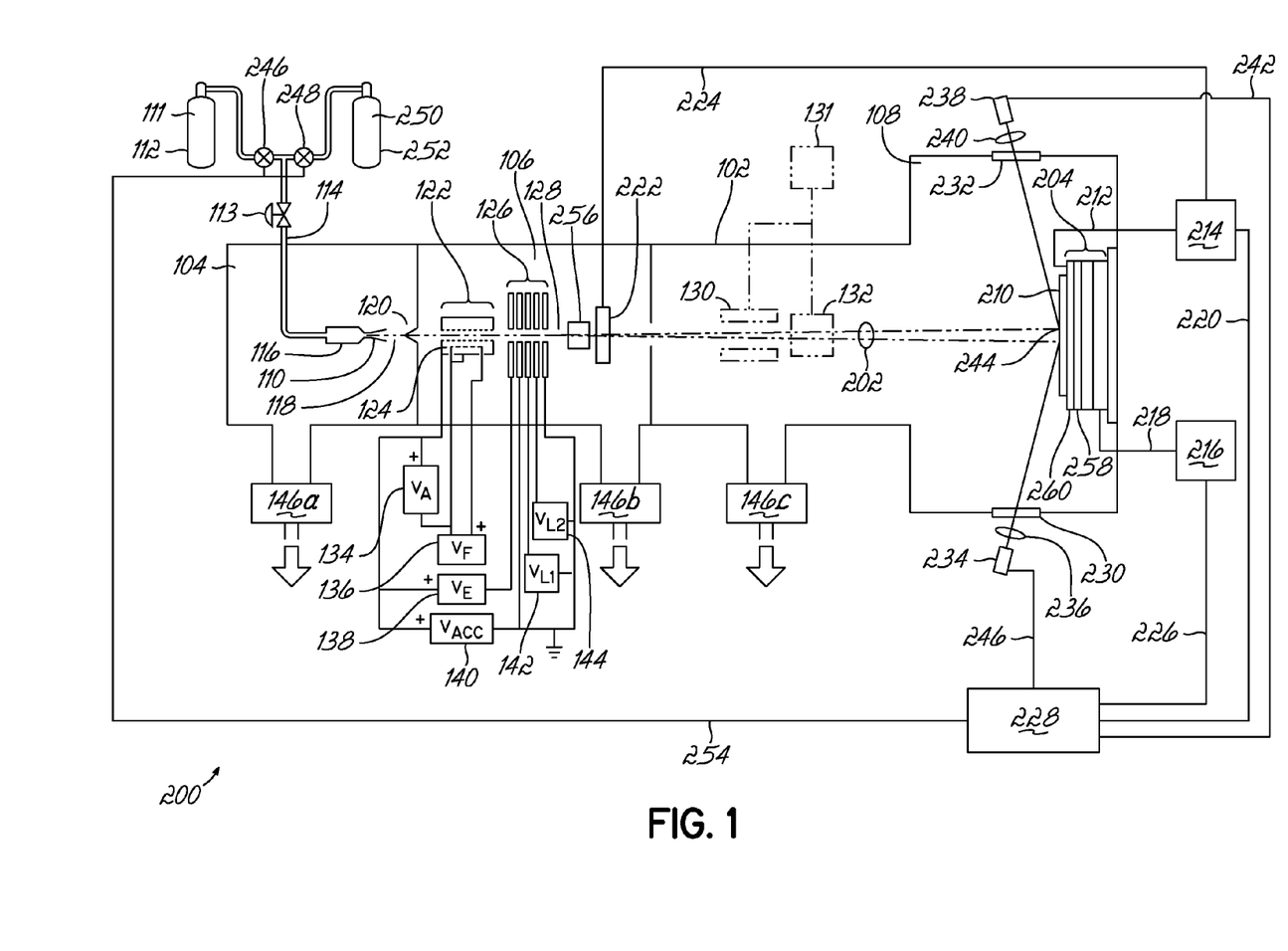
FIG. 1 is a diagrammatic view of one embodiment of a gas cluster ion beam apparatus to modify surface features of a workpiece.

With reference to FIG. 1, a GCIB processing apparatus 200 includes a vacuum vessel 102 divided into communicating chambers that include a source chamber 104, an ionization/acceleration chamber 106, and a processing chamber 108 separated from the source chamber 104 by the ionization/acceleration chamber 106. The chambers 104, 106, 108 are evacuated to suitable operating pressures by vacuum pumping systems 146a, 146b, and 146c, respectively. A condensable source gas 111 (for example, argon (Ar), carbon dioxide ($CO_2$), oxygen ($O_2$), or nitrogen ($N_2$)) stored in a source gas cylinder 112 is admitted under pressure through a gas metering valve 113 and a gas feed tube 114 into a stagnation chamber 116. The source gas is subsequently ejected from the stagnation chamber 116 into the substantially lower pressure vacuum inside the source chamber 104 through a properly shaped nozzle 110. A gas jet 118 results inside the source chamber 104. Cooling, which results from the rapid expansion of the gas jet 118, causes a portion of the gas jet 118 to condense into clusters, each consisting of from several to several thousand weakly bound atoms or molecules.

A gas skimmer aperture 120 situated between the source chamber 104 and ionization/acceleration chamber 106 partially separates any gas molecules that have not condensed into clusters from those that have condensed and become part of the gas jet 118. The removal of the un-condensed gas molecules minimizes pressure perturbations in the downstream regions where such higher pressures would be detrimental, such as in the ionization/acceleration chamber 106 near ionizer 122 and high voltage electrodes 126 and in the processing chamber 108.

After the gas jet 118 has been formed in the source chamber 104, the constituent gas clusters in gas jet 118 are ionized by ionizer 122. The ionizer 122 is typically an electron impact ionizer that produces electrons from one or more filaments 124. The ionizer 122 also accelerates and directs the electrons causing them to collide with the gas clusters in the gas jet 118 inside the ionization/acceleration chamber 106. The electron impact ejects electrons from molecules in the gas clusters to generate ionized molecules and thereby endows the gas clusters with a net positive charge to define ionized clusters. A filament power supply 136 provides voltage $V_F$ to heat the ionizer filament 124.

A set of suitably biased high voltage electrodes 126 in the ionization/acceleration chamber 106 extracts the ionized clusters from the ionizer 122. The high voltage electrodes 126 then accelerate the extracted ionized clusters to a desired energy and focus them to define the GCIB 128. The GCIB 128 is accelerated with an accelerating potential ranging from about 1 kV to several tens of kV. Anode power supply 134 provides voltage $V_A$ for accelerating electrons emitted from filament 124 and causing the electrons to bombard the gas clusters in gas jet 118, which produces ionized clusters.

Extraction power supply 138 provides voltage $V_E$ to bias at least one of the high voltage electrodes 126 to extract ions from the ionizing region of ionizer 122 and to form the GCIB 128. Accelerator power supply 140 provides voltage $V_{Acc}$ to bias one of the high voltage electrodes 126 with respect to the ionizer 122 to extract and focus the GCIB 128. Lens power supplies 142, 144 may be provided to bias some of the high voltage electrodes 126 with potentials (e.g., $V_{L1}$ and $V_{L2}$) to focus the GCIB 128. A beam filter 256 in the ionization/acceleration chamber 106 eliminates monomers or monomers and light ionized clusters from the GCIB 128 to define a GCIB 202 that enters the processing chamber 108. An adjustable aperture may be incorporated with the beam filter 256 or included as a separate device (not shown), to throttle or variably block a portion of a gas cluster ion beam flux thereby reducing the GCIB beam current to a desired value. The adjustable aperture may be employed alone or with other devices and methods known to one skilled in the art to reduce the gas cluster ion beam flux to a very small value including varying the gas flow from a GCIB source supply; modulating the ionizer by either varying a filament voltage $V_F$ or varying an anode voltage $V_A$; or modulating the lens focus by varying lens voltages $V_{L1}$ and/or $V_{L2}$.

A beam gate 222 is disposed in the path of GCIB 128 in the ionization/acceleration chamber 106. Beam gate 222 has an open state in which the GCIB 128 is permitted to pass from the ionization/acceleration chamber 106 to the processing chamber 108 to define GCIB 202 and a closed state in which the GCIB 128 is blocked from entering the processing chamber 108. A control cable 224 conducts control signals from dosimetry processor 214 to beam gate 222. The control signals controllably switch beam gate 222 to between the open or closed states.

A workpiece 210, which may be a semiconductor wafer or other substrate to be processed by GCIB processing, is disposed in the path of the GCIB 202 in the processing chamber 108 using a handler (not shown). Because most applications contemplate the processing of large workpieces 210 with spatially uniform results, a scanning system may be desirable to uniformly scan the GCIB 202 across large areas.

The GCIB 202 directed at the workpiece 210 may be substantially stationary (i.e., un-scanned). Workpiece 210 is held in the processing chamber 108 on a X-Y positional support 204 operable to move the workpiece 210 in two axes, effectively scanning the workpiece 210 relative to the GCIB 202. The GCIB 202 impacts the workpiece 210 at a projected impact region 244 on a surface of the workpiece 210. By X-Y motion, the X-Y positional support 204 can position each portion of a surface of the workpiece 210 in the path of GCIB 202 so that every region of the surface may be made to coincide with the projected impact region 244 for processing by the GCIB 202.

An X-Y controller 216 provides electrical signals to the X-Y positional support 204 through an electrical cable 218 for controlling the position and velocity in each of X-axis and Y-axis directions. The X-Y controller 216 receives control signals from, and is operable by, system controller 228 through an electrical cable 226. X-Y positional support 204 moves by continuous motion or by stepwise motion according to conventional X-Y table positioning technology to position different regions of the workpiece 210 within the projected impact region 244. In one embodiment, X-Y positional support 204 is programmably operable by the system controller 228 to scan, with programmable velocity, any portion of the workpiece 210 through the projected impact region 244 for GCIB processing by the GCIB 202.

Alternatively, orthogonally oriented electrostatic scan plates 130, 132 can be utilized to produce a raster or other scanning pattern of the GCIB 202 across the desired processing area on workpiece 210, instead of or in addition to using X-Y positional support 204. When beam scanning is performed, a scan generator 131 provides X-axis and Y-axis scanning signal voltages to the scan plates 130, 132. The scanning signal voltages are commonly triangular waves of different frequencies that cause the GCIB 202 to scan the surface of workpiece 210.

The workpiece holding surface 260 of X-Y positional support 204 is electrically conductive and is connected to a dosimetry processor 214 by an electrical lead 212. An electrically insulating layer 258 of X-Y positional support 204 isolates the workpiece 210 and workpiece holding surface 260 from the other portions of the X-Y positional support 204. Electrical charge induced in the workpiece 210 by the impinging GCIB 202 is conducted through workpiece 210, workpiece holding surface 260, and electrical lead 212 to the dosimetry processor 214 for measurement. Dosimetry processor 214 has integrating means for integrating the GCIB current to determine a GCIB processing dose. Under certain circumstances, a target-neutralizing source (not shown) of electrons, sometimes referred to as electron flood, may be used to neutralize the GCIB 202. In such case, a Faraday cup (not shown) may be used to assure accurate dosimetry despite the added source of electrical charge.

The processing chamber 108 includes optical windows 230 and 232. An optical transmitting transducer 234, which may also have additional transmitting optics 236, and an optical receiving transducer 238, which may also have additional receiving optics 240, form a conventional optical instrumentation system. The transmitting transducer 234 receives, and is responsive to, controlling electrical signals from the system controller 228 communicated through an electrical cable 246. The transmitting transducer 234 directs an optical beam through the optical window 230 toward the workpiece 210. The receiving transducer 238 detects the optical beam, after interaction with workpiece 210, through optical window 232. The receiving transducer 238 sends measurement signals to the system controller 228 through an electrical cable 242.

In addition to source gas cylinder 112, the GCIB processing apparatus 200 has a second gas cylinder 252 for containing a reactive gas 250, that may be, for example, oxygen, nitrogen, carbon dioxide, nitric oxide, nitrous oxide, sulfur hexafluoride, water vapor, an oxygen-containing gas, or a nitrogen-containing gas. Shut-off valves 246 and 248 are operable by signals transmitted through electrical cable 254 by system controller 228 to select either condensable source gas 111 or reactive gas 250 for GCIB processing.

The dosimetry processor 214 may be one of many conventional dose control circuits that are known in the art and may include, as a part of its control system, all or part of a programmable computer system. The X-Y controller 216 may include as part of its logic all, or part of, a programmable computer system. The dosimetry processor 214 may include as part of its logic all, or part of, a programmable computer system. Some or all of the logic of the X-Y controller 216 and dosimetry processor 214 may be performed by a small general purpose computer that also controls other portions of the GCIB processing apparatus, including the system controller 228.

In operation, the dosimetry processor 214 signals the opening of the beam gate 222 to irradiate the workpiece 210 with the GCIB 202. The dosimetry processor 214 measures the GCIB current collected by the workpiece 210 to compute the accumulated dose received by the workpiece 210. When the dose received by the workpiece 210 reaches a predetermined required dose, the dosimetry processor 214 closes the beam gate 222 and processing of the workpiece 210 is complete.

The dosimetry processor 214 is electrically coupled with the system controller 228 by an electrical cable 220. During processing of the workpiece 210, the dose rate is communicated by the dosimetry processor 214 to the system controller 228 by electrical signals transmitted over electrical cable 220. The system controller 228 analyzes the electrical signals to, for example, confirm that the GCIB beam flux is substantially constant or to detect variations in the GCIB beam flux. The X-Y controller 216 is responsive to electrical signals from the system controller 228 that are transmitted over an electrical cable 226. The X-Y controller 216 can scan the X-Y positional support 204 to position every part of the workpiece 210 for processing according to a set of predetermined parameters.

As an alternative method, the GCIB 202 may be scanned at a constant velocity in a fixed pattern across the surface of the workpiece 210, but the GCIB intensity is modulated (often referred to as Z-axis modulation) to deliver an intentionally non-uniform dose to the sample. The GCIB intensity or beam flux may be modulated by any of a variety of methods, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the beam with a variable beam block, adjustable shutter, or adjustable aperture. The modulating variations may be continuous analog variations or may be time modulated switching or gating.

In one embodiment, gas clusters from the GCIB 202 may comprise inert species originating from gas sources such as argon (Ar), neon (Ne), krypton (Kr), and xenon (Xe). For example, an ionized Ar gas cluster ion may impinge a surface of a workpiece 210 and form a shallow impact crater with a diameter of approximately 20 nm and a depth of approximately 10 nm, but less than approximately 20 nm. When imaged using a nano-scale imaging device such as Atomic Force Microscopy (AFM), the impact craters have an appearance similar to indentations. After impact, the inert species from the gas cluster ion escapes the surface of the workpiece 210 as a gas and is exhausted from the processing chamber 108 by the vacuum pumping systems 146a, 146b, and 146c. The composition of the workpiece 210 is not modified by the indentations.

Figure 2:
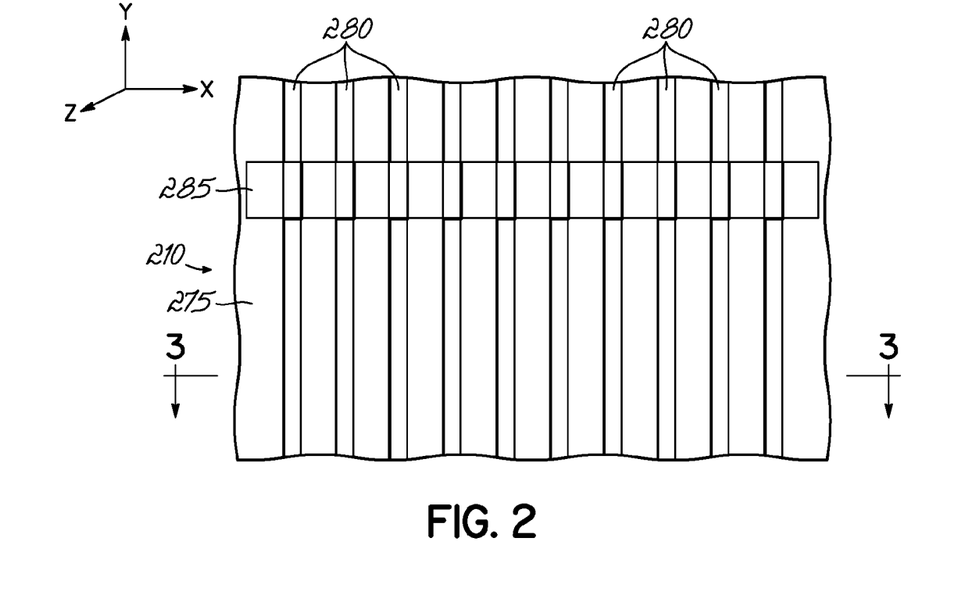
FIG. 2 is a diagrammatic top view of an embodiment of a portion of a workpiece with a plurality of features formed in or on a workpiece.

With reference to FIG. 2, a plurality of features formed in, or on, a portion of a workpiece 210 to impart a topography comprised of one or more planar regions 275, recessed features 280, and raised features 285. The planar regions 275 may be a processed or un-processed crystalline silicon or germanium surface, a layer of dielectric material such as silicon dioxide or silicon nitride, or an organic film such as photoresist or an anti-reflective film. The recessed features 280 may be trenches, vias, or another feature recessed below the surface of the planar region 275. The recessed features 280 may have approximately the same size and shape. Alternatively, the recessed features 280 may have different sizes and shapes. For instance, non-uniformities in an etch rate across the wafer will cause variations in the depths of the recessed features 280, resulting in recessed features 280 characterized by different sizes and shapes.

The raised features 285 may be regions of epitaxial material, crystalline silicon or germanium, a dielectric film such as silicon dioxide, silicon nitride or a high-K material, or a gate material such as doped polysilicon, undoped polysilicon, or a workfunction metal. A workfunction metal is a metal with a known work function, which is an inherent characteristic of the metal expressed in units of electron volts (eV). In one embodiment, the workfunction metal includes titanium nitride, tantalum nitride, or another transition nitride metal.

Figure 3:
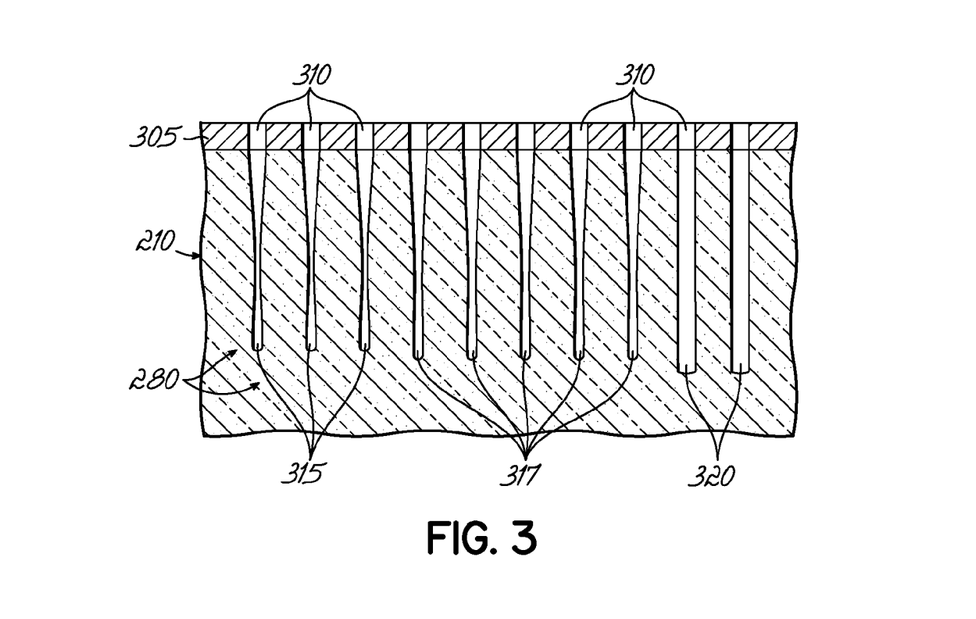
FIG. 3 is a cross-sectional view of trenches formed in a workpiece taken generally along line 3-3 in FIG. 2.

With reference to FIG. 3, the non-uniform recessed features 280 may be trenches formed in the portion of the workpiece 210. The recessed features 280 are formed by coating workpiece 210 with a mask material 305 and defining a plurality of patterned openings 310 in the mask material 305 at the intended locations of the recessed features 280. The patterned openings 310 are used during an etching process to define locations for trenches 315, 317, 320 representing recessed features 280 in workpiece 210. The recessed features 280 may include irregularly shaped shallow trenches 315, 317 and properly shaped shallow trenches 320. Specifically, shallow trenches 315, 317 have non-uniform trench widths in comparison with shallow trenches 320 and trench depths that are shallower than shallow trenches 320. The dimensional variation in trenches 315 in comparison with trenches 320 exceeds the dimensional variations of trenches 317 in comparison with trenches 320.

The trenches 315, 317, 320 may be etched in workpiece 210 using an appropriate etching process and, after etching, may be filled with dielectric material during a complementary metal oxide semiconductor (CMOS) manufacturing process to form, for example, storage capacitors for memory cells in a dynamic random access memory (DRAM). If fabricated using an etching process that is ideally anisotropic, the trenches 315, 317, 320 would include vertical sidewalls. However, because of inherent non-uniformities associated with the etching process, the trenches 315, 317, 320 may include variations that, if uncorrected, can result in unplanned variations in an electrical property, such as the capacitance, of different storage capacitors and detrimentally impact device yields. As another example, the depths of the trenches 315, 317, 320 formed at different locations on the workpiece 210 may vary because of non-uniformities in the etch rate at different locations on the surface of the workpiece 210. As explained below, the uniformity of in one or more dimensions of the trenches 315, 317, 320 may be improved so as to improve the consistency of the electrical property of the storage capacitors for the memory cells of the DRAM, which are formed in the trenches 315, 317, 320, across the workpiece 210 and, thereby, enhance the device yield.

A metrology tool may be used to measure the dimensions of the trenches 315, 317, 320 as an attribute and then to determine a variation in one or more of the dimensions to ascertain a non-uniformity. A spatial map is generated that correlates the non-uniformity in each of the dimensions with the locations of the trenches 315, 317, 320 on the surface of the workpiece 210. A physical measurement, such as the etch depth or the trench width dimensions of the trenches 315, 317, 320, may be measured by the metrology tool. Alternatively, the dimensional variation among the trenches 315, 317, 320 may be assessed by mapping an electrical measurement, such as an electrical property like the final cell capacitance, of memory cells formed using the trenches 315, 317, 320. By measuring the final cell capacitance, for example, contributions from multiple sources of systematic non-uniformity in the physical dimensions of the trenches 315, 317, 320 can be taken into account when applying a corrective process to future workpieces 210.

In one embodiment, the non-uniformity of the trenches 315, 317, 320 is assessed using a metrology tool, such a spectroscopic ellipsometer, which measures a property of these recessed features 280 using electromagnetic radiation and may optionally rely on an optical digital profilometry (ODP) metrology technique. If regularly spaced, the trenches 315, 317, 320 may have the appearance of a periodic grating when viewed from a perspective above the workpiece 210. Electromagnetic radiation that deflects from the periodic grating represented by the trenches 315, 317, 320 is collected as a diffraction signal. The diffraction signal is then analyzed to determine whether the periodic grating and, therefore, the recessed features 280 represented by trenches 315, 317, 320 have been fabricated according to known specifications. To that end, the diffraction signal collected from illuminating the periodic grating (the measured diffraction signal) may be compared to a library of simulated diffraction signals. Each simulated diffraction signal in the library is associated with a hypothetical profile. When a match is made between the measured diffraction signal and one of the simulated diffraction signals in the library, the hypothetical profile associated with the simulated diffraction signal is presumed to represent the actual profile of the periodic grating. Characteristics of the trenches 315, 317, 320 may be measured and spatially mapped accordingly to specify a map of the dimensional variations in the recessed features 280 across the surface of the workpiece 210.

Figure 4:
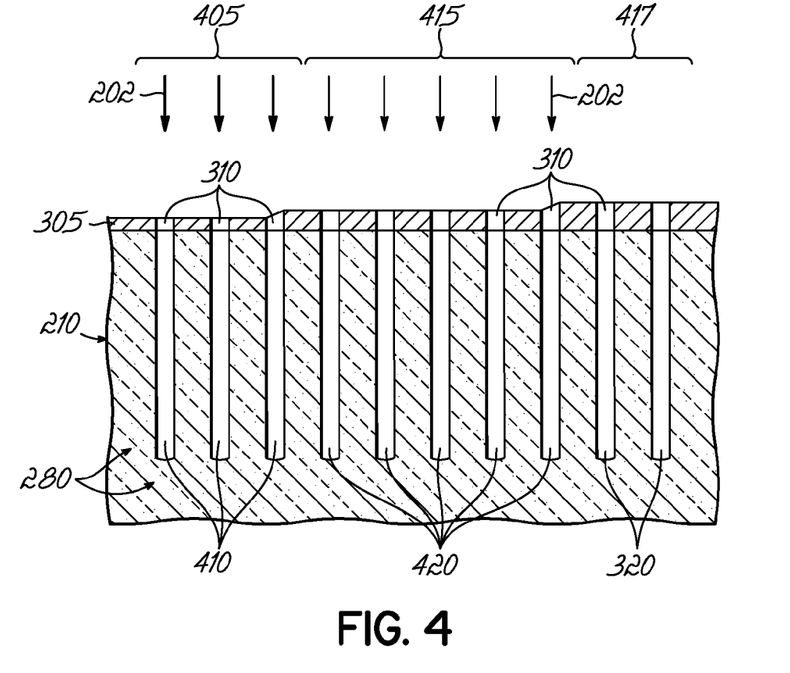
FIG. 4 is a cross-sectional view of the workpiece of FIG. 3 after the workpiece has been modified by exposure to different doses of ionized clusters in a modulated gas cluster ion beam delivered according to a corrective pattern.

The mapped information relating to the trenches 315, 317, 320 is communicated either directly or indirectly from the metrology tool to the system controller 228 for the GCIB processing apparatus 200 (FIG. 1) as a data file. Information from the data file may be used to determine a corrective process pattern that directs the GCIB 202 either to selectively deposit material in the recessed features 280 to locally decrease the dimensions or to selectively etch material from the recessed features 280 to locally increase the dimensions. If material is to be removed from one or more trenches 315, 317 and using a previously measured beam removal function and a previously measured relationship between etch rate and dose for a particular set of GCIB parameters (including GCIB energy and cluster species), a mathematical algorithm may be employed which takes the non-uniformity data communicated from the metrology tool, inverts a beam spot etching pattern to fit the non-uniformity profile, and creates a beam-dose contour to selectively remove material, using the GCIB 202, from the trenches 315, 317, and thereby improve the uniformity of the recessed features 280, as shown in FIG. 4. Many different approaches to the selection of a mathematical algorithm may be successfully employed as understood by a person having ordinary skill in the art.

As shown in FIG. 4, the trenches 315, 317, 320 (FIG. 3) are processed by the GCIB 202 using the corrective process pattern communicated to the system controller 228 of the GCIB processing apparatus 200 as a beam-dose contour or profile for the GCIB 202. The corrective process pattern may require a high GCIB dose over a first region 405 of workpiece 210 containing trenches 315 (FIG. 3), a moderate GCIB dose over a second region 415 of workpiece 210 containing trenches 317 (FIG. 3), and a light or nil (i.e., negligible) GCIB dose over a third region 417 containing trenches 320. In the third region 417, GCIB processing is unnecessary because trenches 320 are properly shaped according to the process specification.

The application of the beam-dose contour in the corrective process pattern effectively improves the dimensional uniformity of the recessed features 280 across the workpiece 210, as reflected in FIG. 4. Specifically, processing using the GCIB 202 in compliance with the corrective process pattern modifies the shape of the trenches 315, 317 to reduce irregularities in their widths and depths, as indicated by the resultant modified trenches 410, 420, respectively. As a result, the dimensions of the modified trenches 410, 420 are better correlated with the dimensions of trenches 320, which were not modified by the GICB 202, so that the statistically averaged trench width and trench depth across the workpiece 210 are more uniform. In alternative embodiments, the GCIB 202 may be used to selectively deposit material in the recessed features 280 to improve the uniformity and reduce the dimensional variations in width and depth among the different recessed features 280. The end result is that at least one of the dimensions of the trenches 320, 410, 420, for example the trench depth, are more nearly equalized across the surface of the workpiece 210.

In one embodiment, the correction process may entail the determination of an inverse or corrective process pattern for multiple workpieces 210 to compensate and correct systematic dimensional non-uniformities using the GCIB 202 among the trenches 315, 317, 320 in future workpieces that are similar or identical to workpiece 210. The corrective process pattern may be determined from conventional modeling of the dependence of the process outcomes based on different process parameters, or by experimental determinations of such relationships using the metrology tool. In the latter regard, dimensional non-uniformities among the trenches 315, 317, 320 may be determined from a plurality of individual workpieces 210 and may be mathematically assessed determine systematic non-uniformities for a lot of workpieces 210. Based upon the mathematical assessment of the dimensional non-uniformities among the trenches 315, 317, 320, the corrective process pattern may be determined and applied as feedback information to correct the systematic non-uniformities in the trenches 315, 317, 320 for workpieces 210 in upcoming lots without an assessment using the metrology tool. The workpieces 210 in upcoming lots, which are processed in an identical or substantially similar manner to the workpieces 210 from which the corrective process pattern was determined, are treated with the GCIB 202 using the corrective process pattern. As a result, future workpieces 210 can be processed using the GCIB 202 without individually assessing the non-uniformity among the trenches 315, 317, 320. In one specific embodiment, the correction methodology may be used to equalize the depths of the trenches 320, 410, 420 in future workpieces 210 by either etching or deposition. This may be useful for improving the electrical properties of storage capacitors for the memory cells of a DRAM.

In different embodiments, the GCIB 202 may be used to either etch material from the recessed features 280, to deposit material in the recessed features 280, or to otherwise modify the recessed features 280 in a manner effective to alleviate the observed dimensional non-uniformities. The GCIB 202 may be used to etch and deposit material on different portions of the same workpiece 210 to correct non-uniformities. In a specific embodiment, the GCIB 202 may include chemically reactive ionized clusters that may result in more rapid processing, material specific processing, and/or differential processing rates for different workpiece materials.

Figure 5:
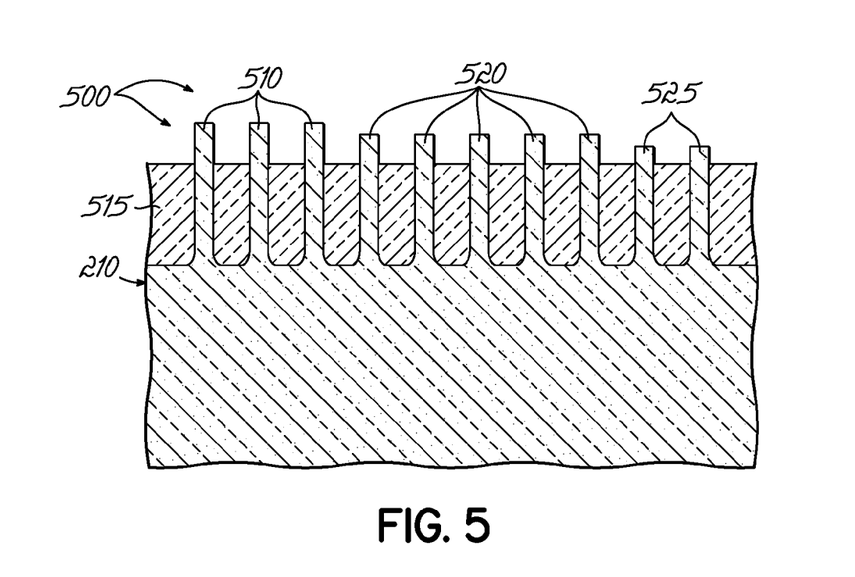
FIG. 5 is a cross-sectional view similar to FIG. 3 of fins formed on a workpiece in accordance with an alternative embodiment.

With reference to FIG. 5 and in an alternative embodiment, a plurality of three-dimensional bodies 500 may formed on a portion of workpiece 210 instead of the trenches 315, 317, 320 (FIG. 3). The three-dimensional bodies 500 may be gate conductors used to form multi-gate transistors, such as dual-gate fin-type field effect transistors (FinFETs) or to form tri-gate transistors with three equal length gates. Because of process non-uniformities, it may be necessary to normalize a height of the three-dimensional bodies to achieve a desired transistor performance. In this embodiment, the three-dimensional bodies 500 includes bodies 525 having a body height consistent with process specifications, bodies 520 having a moderately tall height in comparison with bodies 525, and bodies 510 having a relatively tall height in comparison with bodies 520, 525. In other words, bodies 510 are taller than bodies 520, which themselves are taller than bodies 525. The workpiece 210 may be a single crystal silicon substrate etched anisotropically using a dry-etch process such as sulfur hexafluoride ($SF_6$), oxygen ($O_2$), carbon monoxide (CO), and argon (Ar), or a fluorinated hydrocarbon ($CH_xF_y$) gas in a MERIE or an ECR chamber or tool. Further, a field oxide or a field nitride 515 may be deposited on the workpiece 210 adjacent to the three-dimensional bodies 500.

Figure 6:
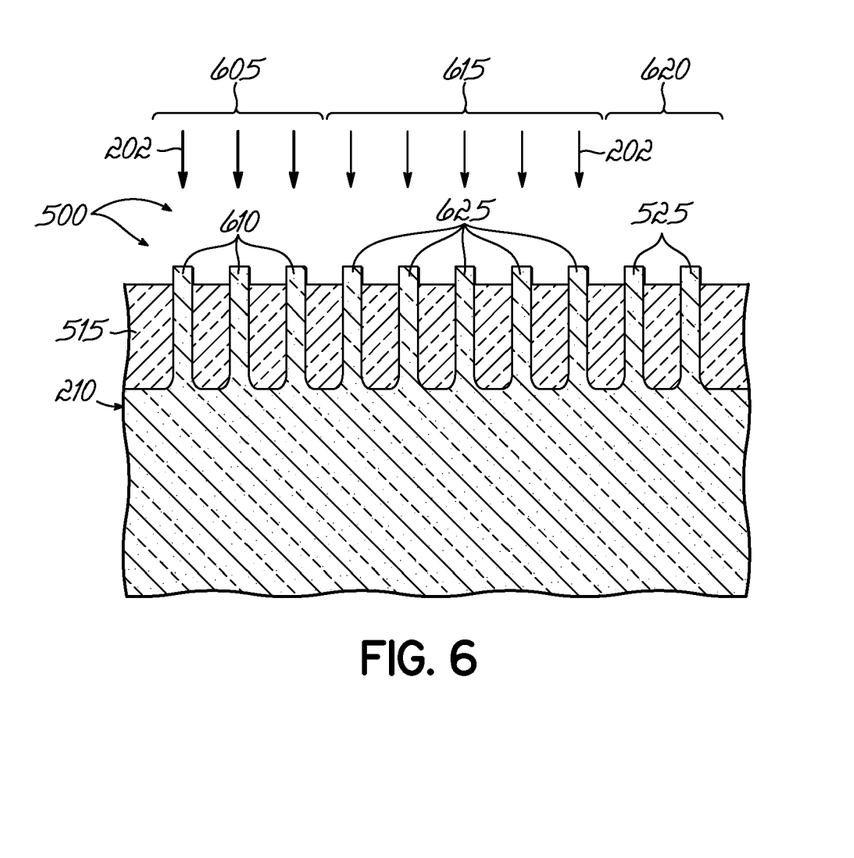
FIG. 6 is a cross-sectional view of the workpiece of FIG. 5 after the workpiece has been modified by exposure to different doses of ionized clusters in a modulated gas cluster ion beam delivered according to a corrective pattern.

As shown in FIG. 6, a correction methodology, which is analogous to the correction methodology used to correct the dimensional and/or electrical irregularities in the recessed features (FIGS. 3, 4) that is described above, is used to reduce the non-uniformity in the dimensions of the three-dimensional bodies 500. Specifically, the corrective process pattern contained in the beam-dose contour may require a high GCIB dose in a first region 605 of workpiece 210 containing the relatively tall bodies 510 (FIG. 5), a moderate dose in a second region 615 of workpiece 210 containing bodies 520 (FIG. 5) of intermediate height in which a moderate GCIB dose is needed, and a light or nil GICB dose in a third region 620 of workpiece 210 containing bodies 525 with heights consistent with the process specification. Similar to the mapped dimensional correction of the recessed features 280 (FIGS. 4, 5), the differential GCIB doses in the beam-dose contour reduces the heights of bodies 510, 520 to produce modified bodies 610, 625, respectively. The modified bodies 610, 625 are more similar in height to bodies 525 than the uncorrected bodies 510, 520. As a result, application of the correction methodology reduces the dimensional variation among the different bodies 525, 610, 625 on the substrate 210.

A person having ordinary skill in the art will appreciate that the workpiece 210 may have both recessed features 280 and three-dimensional bodies 500 that are concurrently modified by the correction methodology. Regardless, the correction methodology is directed to correcting measurable or systematic spatial variations in a dimension of the recessed features 280 and/or three-dimensional bodies 500.

Figure 7:
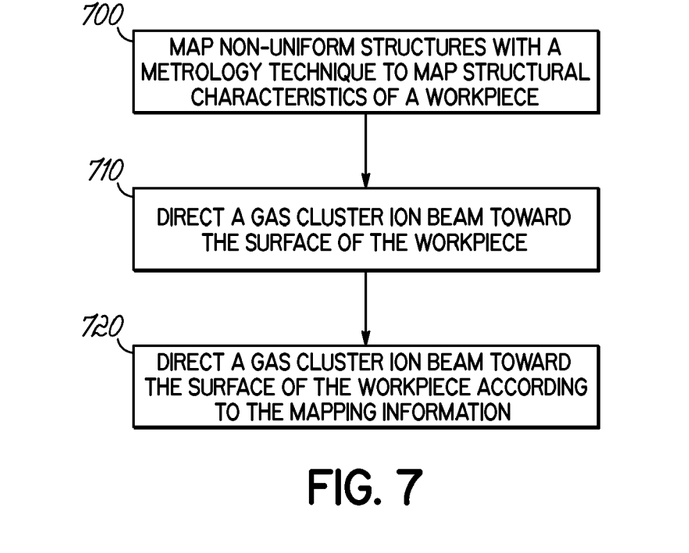
FIG. 7 is a flow chart showing an embodiment of a method of modifying surface features of a workpiece.

FIG. 7 is a flow chart showing an embodiment of a method of modifying surface features of a workpiece. In block 700, non-uniform structures are spatially mapped with a metrology technique to map the structural characteristics or attribute of the features on a surface of a workpiece. The non-uniform structures on the surface of the workpiece 210 may be comprised of planar regions 275, recessed features 280, and/or raised features 285. In block 710, a gas cluster ion beam is directed toward the structures on the surface of the workpiece. In block 720, the gas cluster ion beam is modulated over the surface of the workpiece 210, according to mapping information gathered in block 700 and with different doses supplied in different regions of the surface, to improve the feature uniformity and, thereby, form a series of relatively uniform features. Alternatively, the spatial map assessed from a plurality of workpieces 210 may be used to correct systematical non-uniformities in future workpieces 210 without individually mapping the features on the future workpieces 210 with a metrology technique before correction.

An apparatus and method for modifying surface features of a workpiece is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of treating a plurality of features on a surface of a workpiece using a gas cluster ion beam, the method comprising:

measuring an attribute of the features;

correlating the attribute of each of the features with a spatial location on the surface to generate a spatial map;

directing ionized clusters in the gas cluster ion beam toward the surface of the workpiece; and based on the spatial map, modulating delivery of the gas cluster ion beam across the surface of the workpiece so that different features in different regions on the surface receive different doses of the ionized clusters.

2. The method of claim 1 wherein the attribute is a dimension of the features, and measuring the attribute of the features further comprises:

measuring the dimension of each of the features; and assessing a non-uniformity of the dimension among the features to generate the spatial map.

3. The method of claim 2 wherein modulating delivery of the gas cluster ion beam further comprises:

selecting the different doses to reduce the non-uniformity of the dimension among the features.

4. The method of claim 2 wherein the features are recesses extending into the surface, and modulating the delivery of the gas cluster ion beam further comprises:

etching the recesses in the different regions of the surface by different amounts to reduce the non-uniformity of the dimension among the recesses.

5. The method of claim 2 wherein the features are recesses extending into the surface, and modulating the delivery of the gas cluster ion beam further comprises:

depositing different amounts of a material inside the recesses in the different regions of the surface to reduce the non-uniformity of the dimension among the recesses.

6. The method of claim 2 wherein the features are three-dimensional bodies projecting from the surface, and modulating the delivery of the gas cluster ion beam further comprises:

etching the three-dimensional bodies by different amounts in the different regions of the surface to reduce the non-uniformity of the dimension among the three-dimensional bodies.

7. The method of claim 2 wherein the features are three-dimensional bodies projecting from the surface, and modulating the delivery of the gas cluster ion beam further comprises:

depositing different amounts of a material on the three-dimensional bodies in the different regions of the surface to reduce the non-uniformity of the dimension among the three-dimensional bodies.

8. A method of using a gas cluster ion beam, the method comprising:

measuring an attribute of the features on a plurality of workpieces;

correlating the attribute of each of the features with a spatial location on the surface to generate a spatial map;

directing ionized clusters in the gas cluster ion beam toward the surface of another workpiece; and based on the spatial map, modulating delivery of the gas cluster ion beam across the surface of the another workpiece so that different features in different regions on the surface of the another workpiece receive different doses of the ionized clusters.

9. The method of claim 8 wherein the attribute is an electrical property, and measuring the attribute of the features on the plurality of workpieces further comprises:

assessing a non-uniformity of the electrical property among the features on the surface of each of the plurality of workpieces to generate the spatial map.

10. The method of claim 8 wherein the attribute is a dimension of the features, and measuring the attribute of the features further comprises:

measuring the dimension of each of the features on the surface of each of the plurality of workpieces; and assessing a non-uniformity of the dimension among the features to generate the spatial map.

11. The method of claim 10 wherein modulating delivery of the gas cluster ion beam further comprises:

selecting the different doses to reduce the non-uniformity of the dimension among the features on the surface of the another workpiece.

12. The method of claim 10 wherein the features are recesses extending into the surface of the plurality of workpieces and the another workpiece, and modulating the delivery of the gas cluster ion beam further comprises:

etching the recesses in the different regions of the surface of the another workpiece by different amounts to reduce the non-uniformity of the dimension among the recesses.

13. The method of claim 10 wherein the features are recesses extending into the surface of the plurality of workpieces and the another workpiece, and modulating the delivery of the gas cluster ion beam further comprises:

depositing different amounts of a material inside the recesses in the different regions of the surface of the another workpiece to reduce the non-uniformity of the dimension among the recesses.

14. The method of claim 10 wherein the features are three-dimensional bodies projecting from the surface of the plurality of workpieces and the another workpiece, and modulating the delivery of the gas cluster ion beam further comprises:

etching the three-dimensional bodies in the different regions of the surface of the another workpiece by different amounts to reduce the non-uniformity of the dimension among the three-dimensional bodies.

15. The method of claim 10 wherein the features are three-dimensional bodies projecting from the surface of the plurality of workpieces and the another workpiece, and modulating the delivery of the gas cluster ion beam further comprises:

depositing different amounts of a material on the three-dimensional bodies in the different regions of the surface of the another workpiece to reduce the non-uniformity of the dimension among the three-dimensional bodies.

* * * * *

UNITED STATES PATENT AND TRADEMARK OFFICE
CERTIFICATE OF CORRECTION

PATENT NO. : 7,626,183 B2 Page 1 of 1
APPLICATION NO. : 11/850423
DATED : December 1, 2009
INVENTOR(S) : Reinhard Wagner et al.

It is certified that error appears in the above-identified patent and that said Letters Patent is hereby corrected as shown below:

In column 5, line 49, before "comprised", insert --are--.

In column 6:
Line 39, after "uniformity", delete "of".
Line 64, change "such a" to --such as--.

In column 8:
Line 25, after "assessed", insert --to--.
Line 56, after "may", insert --be--.

Signed and Sealed this

Sixth Day of April, 2010

David J. Kappos
*Director of the United States Patent and Trademark Office*

UNITED STATES PATENT AND TRADEMARK OFFICE
Certificate

Patent No. 7,626,183 B2                                                     Patented: December 1, 2009

On petition requesting issuance of a certificate for correction of inventorship pursuant to 35 U.S.C. 256, it has been found that the above identified Patent, through error and without any deceptive intent, improperly sets forth the inventorship.

Accordingly, it is hereby certified that the correct inventorship of this Patent is: Reinhard Wagner, Ilmmuenster (DE); Wesley Skinner, Andover, MA (US); Steven P. Caliendo, Ashby, MA (US); Nicolaus J. Hofmeester, Danvers, MA (US); Ruairidh MacCrimmon, Arlington, MA (US); and John J. Hautala, Beverly, MA (US).

Signed and Sealed this Twenty-fourth Day of July 2012.

*ROBERT KIM*
*Supervisory Patent Examiner*
*Art Unit 2881*
*Technology Center 2800*